United States Patent [19]
Kiefer

[11] Patent Number: 5,777,844
[45] Date of Patent: *Jul. 7, 1998

[54] ELECTRONIC CONTROL WITH HEAT SINK

[75] Inventor: James R. Kiefer, Fort Wayne, Ind.

[73] Assignee: General Electric Company, Fort Wayne, Ind.

[*] Notice: This patent issued on a continued prosecution application filed under 37 CFR 1.53(d), and is subject to the twenty year patent term provisions of 35 U.S.C. 154(a)(2).

[21] Appl. No.: 705,605

[22] Filed: Aug. 30, 1996

[51] Int. Cl.$^6$ .................................................. H05N 7/20
[52] U.S. Cl. .................. 361/704; 165/80.3; 174/16.3; 361/690; 361/709; 361/715; 361/720
[58] Field of Search .................... 165/80.2, 80.3; 174/16.3; 361/690, 704, 707, 709–711, 174–722, 730, 748, 752–753

[56] References Cited

U.S. PATENT DOCUMENTS

| | | | |
|---|---|---|---|
| 4,471,407 | 9/1984 | Sleder | 361/387 |
| 4,521,827 | 6/1985 | Jordan et al. | 361/386 |
| 4,628,407 | 12/1986 | August et al. | 361/388 |
| 4,914,551 | 4/1990 | Anschel et al. | 361/389 |
| 5,045,971 | 9/1991 | Ono et al. | 361/704 |
| 5,138,523 | 8/1992 | Benck et al. | 361/386 |
| 5,272,599 | 12/1993 | Koenen | 361/710 |
| 5,305,185 | 4/1994 | Samarov et al. | 361/704 |
| 5,307,236 | 4/1994 | Rio et al. | 361/720 |
| 5,311,395 | 5/1994 | McGaha et al. | 361/720 |
| 5,367,193 | 11/1994 | Malladi | 257/707 |
| 5,379,185 | 1/1995 | Griffin et al. | 361/709 |
| 5,423,192 | 6/1995 | Young et al. | 62/228.4 |
| 5,455,457 | 10/1995 | Kurokawa | 257/712 |
| 5,491,978 | 2/1996 | Young et al. | 62/126 |
| 5,521,439 | 5/1996 | Casati et al. | 257/718 |
| 5,611,393 | 3/1997 | Vasconcelos et al. | 165/80.3 |

FOREIGN PATENT DOCUMENTS

| | | | |
|---|---|---|---|
| 0 332 909 A | 9/1989 | European Pat. Off. | |
| 32 03 609 A1 | 8/1983 | Germany | |
| 5-335764A | 12/1993 | Japan | |
| 6069389 | 3/1994 | Japan | 361/711 |
| 8-153986A | 6/1996 | Japan | |

OTHER PUBLICATIONS

EPO , "European Search Report, Application No. EP 97 30 6591," Dec. 9, 1997 pp. 1–3.

Primary Examiner—Gregory D. Thompson
Attorney, Agent, or Firm—Enrique J. Mora

[57] ABSTRACT

An electronic control has a heat sink which is electrically isolated from electrical components mounted on a printed circuit board of the control by the printed circuit board itself. Thus, the use of additional materials which are thermally conductive but electrically insulating is avoided. A distributor sheet on the printed circuit board distributes heat substantially uniformly over its surface where contacted by the heat sink to promote heat transfer. The heat sink is shaped to permit devices to be mounted on the same side of the printed circuit board as the heat sink while avoiding contact with the heat sink.

17 Claims, 3 Drawing Sheets

5,777,844

1

ELECTRONIC CONTROL WITH HEAT SINK

BACKGROUND OF THE INVENTION

This invention relates generally to heat dissipation in electronic controls and more particularly to an electronic control with a heat sink.

It is frequently necessary to provide heat sinks for dissipating the heat generated by power electronic circuits. The problem is particularly acute when the power electronic circuit is completely enclosed. However in many applications, is necessary to provide such enclosure of the power electronic surface to protect it from dust and other particulate matter. Inside the enclosure, there is insufficient air movement to adequately dissipate the heat. It is necessary to provide a heat sink structure to provide a pathway for heat from the electronic circuit to outside the enclosure where the heat can be dissipated to the air or other suitable heat transfer medium.

Most efficient heat transfer occurs when the heat sink is contacting the source of heat (e.g., a power device on a printed circuit board). The heat sink is made of material (usually metal) which has not only a high thermal conductivity for withdrawing the heat, but also is electrically conductive. The heat sink, which is grounded, must not ground the power devices contacted by the heat sink. One solution is to interpose a material between the power device and the heat sink which is thermally conductive, but also an electric insulator to electrically isolate the power devices from the heat sink. In that instance, electrically insulating spring clips or screws are used to hold the power device and heat sink together. This arrangement of the heat sink and power device will operate satisfactorily to remove heat from the power device. However, the materials are expensive and it is difficult to assemble the heat sink and power device.

SUMMARY OF THE INVENTION

Among the several objects and features of the present invention may be noted the provision of a printed circuit board and heat sink assembly which is easy to put together; the provision of such an assembly which can be manufactured rapidly; the provision of such an assembly which is relatively inexpensive; the provision of such an assembly requiring fewer parts; the provision of such an assembly which electrically isolates a power device of the electronic control from the heat sink while maintaining good thermal contact with the device; and the provision of such an assembly which uses the printed circuit board to electrically isolate the heat sink from the power device.

Generally, an electronic control comprising a printed circuit board made of electrically insulating material and having circuitry thereon including at least one electrical component which generates heat in operation that must be dissipated to prevent failure. The heat-generating electrical component is mounted on a first face of the printed circuit board. A heat sink for transferring heat from the heatgenerating electrical component on the printed circuit board comprises a plate made of thermally conductive material. The plate has a depression having a bottom wall lying generally in a plane, at least portions of the plate adjacent to the depression being disposed out of the plane to one side thereof. The heat sink is disposed adjacent to a second face of the printed circuit board and the bottom wall of the depression is in thermal contact with the second face of the printed circuit board generally opposite the heat-generating electrical component on the first face of the printed circuit board. The heat sink and printed circuit board are constructed and arranged for transferring heat through the printed circuit board generally from the first face to the second face and thence to the heat sink, the printed circuit board electrically isolating the heat sink from the circuitry on the printed circuit board.

Other objects and features of this invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENT

Figure 1:
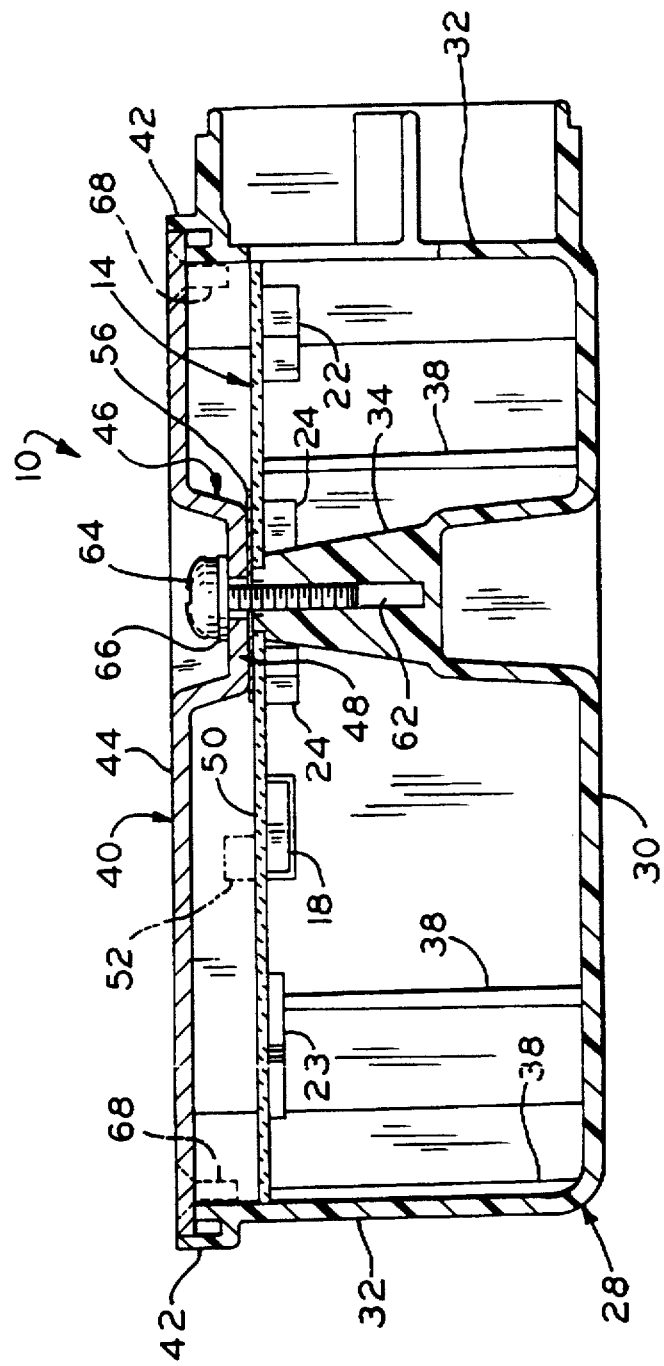
FIG. 1 is a cross section of an electronic control having a heat sink of the present invention.
Figure 5:
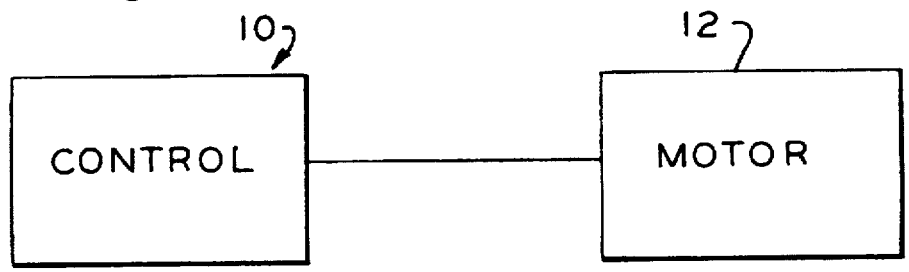
FIG. 5 is a schematic illustrating the connection of the electronic control to a motor.
Figures 3, 4:
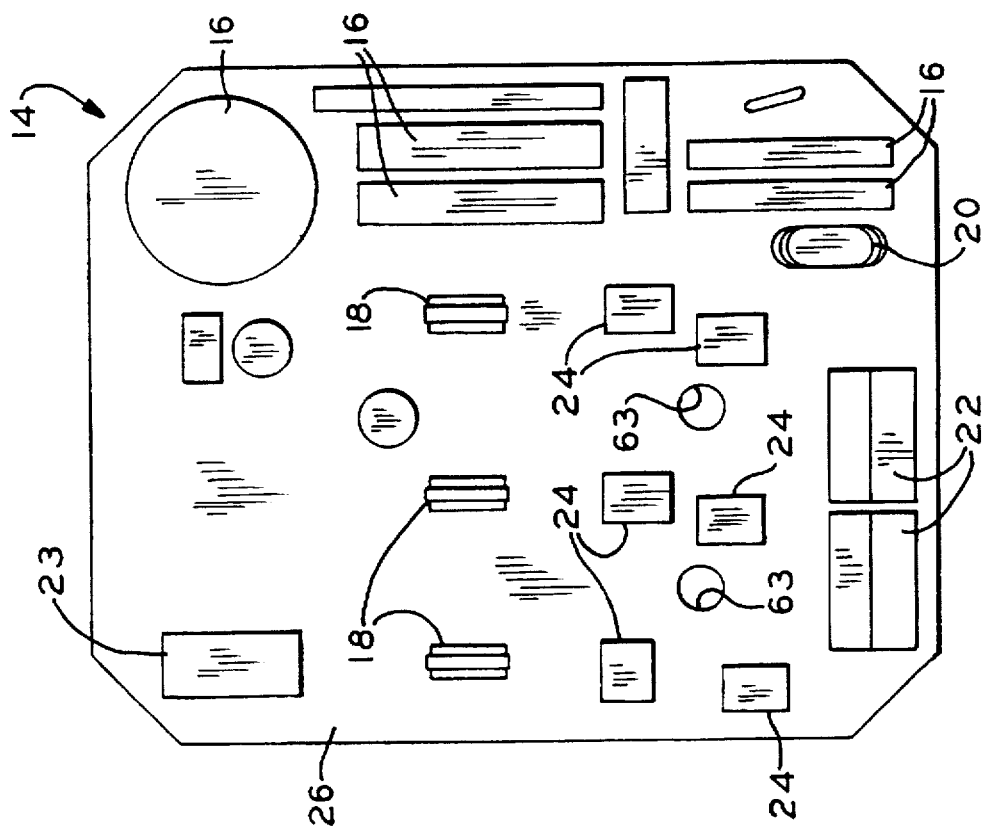
FIG. 3 is a top plan view of a printed circuit board of the electronic control.
FIG. 4 is a bottom plan view of the printed circuit board.

Referring now to the drawings, and in particular to FIG. 1, an electronic control constructed according to the principles of the present invention is designated generally at 10. The control 10 may be used, for instance, to operate an ECM compressor motor 12 (FIG. 5) of the type disclosed in co-assigned U.S. Pat. Nos. 5,423,192 and 5,491,978, which are incorporated herein by reference. The electronic control 10 comprises a printed circuit board, generally indicated at 14, mounting various electrical components such as capacitors 16, transformers 18, thermistor 20, connectors 22 and an integrated circuit 23. In addition, the printed circuit board 14 also mounts heat-generating components, such as FETs 24 on a first face 26 of the printed circuit board (FIG. 4). The precise components mounted on the printed circuit board 14 will depend upon the particular application, such as the control of the ECM compressor motor 12. The printed circuit board 14 is made of a suitable electrically insulating material and is supported by a housing, generally indicated at 28, made of polymeric material and have a generally rectangular, cup-shaped configuration.

The housing 28 (broadly, "enclosure member") has a bottom wall 30, side walls 32 and an open top. The printed circuit board 14 rests on a pair of internal pedestals 34 (only one is shown) and the upper ends of ribs 38 formed at spaced apart locations in the interior of the side walls 32. The open top of the housing 28 is closed by a heat sink, generally indicated at 40, which rests on an upper edge of the side walls 32. The housing 28 also has a lip 42 extending substantially around the perimeter of the open top. The lip 42 is disposed laterally outwardly from the upper edges of the side walls 32 and locates the heat sink 40 relative to the housing 28. It is to be understood that the heat sink 40 could be used for dissipating heat other than from enclosed electronic controls without departing from the scope of the present invention.

Figure 2:
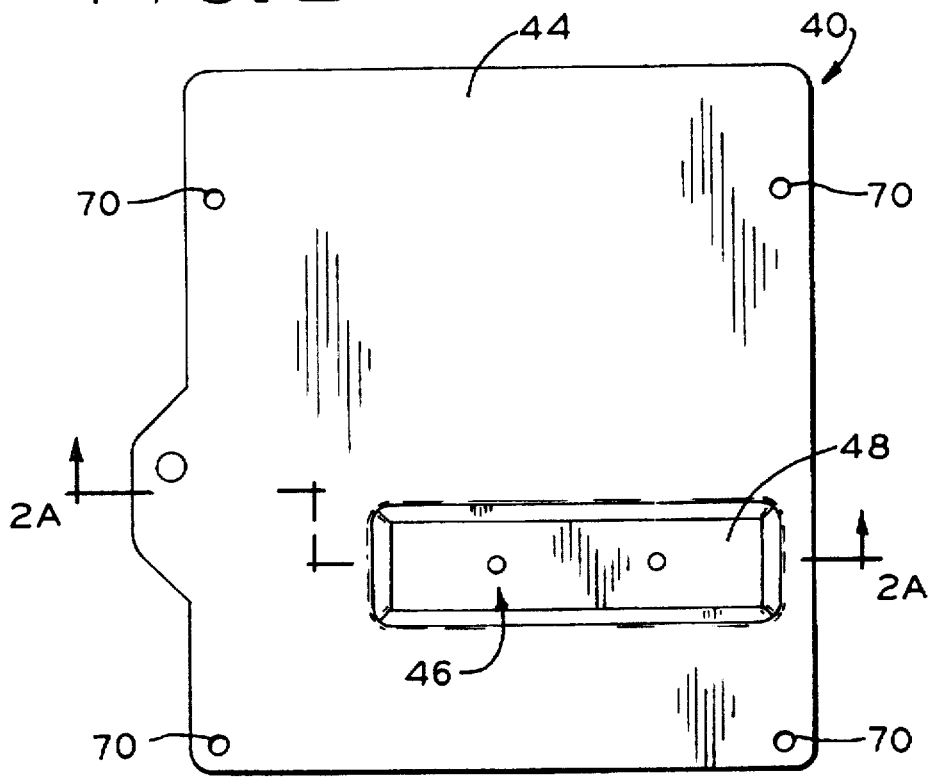
FIG. 2 is a top plan view of the heat sink.
Figure 2A:
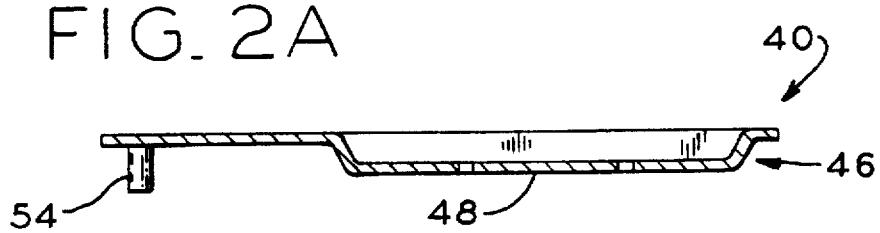
FIG. 2A is a section of the heat sink taken as indicated by line 2A–2A of FIG. 2.

Referring now also to FIGS. 2 and 2A, the heat sink 40 is made as one piece of aluminum (or other thermally conductive material), and has an external surface 44 when mounted on the housing 28 exposed to the air for transferring heat from the heat sink. The heat sink 40 is generally flat, but has a trough-shaped depression, generally indicated at 46, formed in it. A bottom wall 48 of the depression lies in plane and the remainder of the heat sink 40 lies above the plane. As attached to the housing 28, the bottom wall 48 of the depression 46 is in thermal contact with a second face 50 of the printed circuit board 14 on the opposite side of the printed circuit board from the FETs 24. Heat from the FETs 24 is transferred through the printed circuit board 14 from the first face 26 to the second face 50 to the bottom wall 48 of the depression 46. The printed circuit board 14 itself serves and an electrical insulator between the heat sink 40 and the FETs 24 so that no separate electrical insulator is required. Moreover, the spacing between the bottom wall 48 of the depression 46 and the remainder of the heat sink 40 allows additional electronic components to be mounted on the second face 50 of the printed circuit board 14 without coming into contact with the heat sink. In the illustrated embodiment, no such components are mounted on the second face 50, however a component such as a surface mount component 52 may be mounted on the second face as shown in phantom in FIG. 1. The heat sink 40 is grounded by way of a ground post 54 (FIG. 2A) formed one piece with the remainder of the heat sink.

To enhance heat transfer to the heat sink 40, a grounded copper pad 56 (broadly, "distributor sheet") is mounted on the second face 50 of the printed circuit board 14 directly opposite the FETs 24 (FIG. 3). As illustrated by the hidden line representation of the FETs in FIG. 3, each of the FETs 24 at least partially underlies the copper pad 56 to maximize heat transfer from the FET. Moreover, the copper pad 56 is shaped to extend over at least a portion of each FET 24. The second face 50 of the printed circuit board also mounts various traces 58 needed for the control 10 to function. The traces 58 and the various components (16, 18, 20, 22-24, 52) may be broadly referred to as "circuitry". The copper pad 56 includes a generally rectangular main section 60 which is approximately the same size of the bottom wall 48 of the heat sink depression 46 and engages the bottom wall of the heat sink 40. A trace 61 extends from the copper pad 56 for connecting the pad to ground. Heat transferred through the printed circuit board 14 tends to remain highly localized on the second face 50 of the printed circuit board over the FET 24 from which the heat originated. The more thermally conductive copper pad 56 spreads the heat out substantially equally over its volume so that substantial heat transfer occurs over the entire area of contact between the copper pad and the bottom wall 48 of the heat sink 40.

The heat sink 40 and printed circuit board 14 are secured to each other and to the housing 28 by a pair of screws 64 (FIG. 2) which are received through the bottom wall 48 of the depression 46 in the heat sink, through holes 63 the printed circuit board (and copper pad 56) and into threaded holes 62 in the pedestals 34 of the housing. As shown in FIG. 1, a lock washer 66 is used to maintain tight engagement of the screw 64 with the bottom wall 48 of the heat sink 40 for holding the bottom wall in secure, face-to-face engagement with the copper pad 56 over substantially the entire surface area of the lower face of the bottom wall. The engagement of the bottom wall 48 with the copper pad 56 is illustrated by phantom lines on the main section 60 of the copper pad in FIG. 3. In this way, substantial heat transfer is maintained throughout the life of the electronic control 10. The heat sink 40 is additionally secured to the housing 28 by screws 68 (FIG. 1) which are received through holes 70 (FIG. 2) generally at the periphery of the heat sink.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. An electronic control comprising:
    a printed circuit board made of electrically insulating material and having circuitry thereon including at least one electrical component which generates heat in operation that must be dissipated to prevent failure, the heat-generating electrical component being mounted on a first face of the printed circuit board;
    a heat sink for transferring heat from the heat-generating electrical component on the printed circuit board, the heat sink comprising a plate made of thermally conductive material, the plate including a depression having a bottom wall lying generally in a plane, at least portions of the plate adjacent to the depression being disposed out of the plane to one side thereof;
    the heat sink being disposed adjacent to a second face of the printed circuit board, the bottom wall of the depression being in thermal contact with the second face of the printed circuit board generally opposite the heat-generating electrical component on the first face of the printed circuit board, the heat sink and printed circuit board being constructed and arranged for transferring heat through the printed circuit board generally from the first face to the second face and thence to the heat sink, the printed circuit board electrically isolating the heat sink from the circuitry on the printed circuit board.

2. An electronic control as set forth in claim 1 wherein the control is free of electrically insulating material between the bottom wall of the heat sink depression and the second face of the printed circuit board.

3. An electronic control as set forth in claim 2 further comprising a distributor sheet of thermally conductive material mounted on the second face of the printed circuit board opposite the heat-generating electrical component, the distributor sheet distributing the heat transferred from the electrical component through the printed circuit board over the volume of the distributor sheet, the bottom wall of the heat sink engaging the distributor sheet.

4. An electronic control as set forth in claim 3 wherein the bottom wall is in face-to-face engagement with the distributor sheet over substantially the entire surface area of the bottom wall.

5. An electronic control as set forth in claim 4 wherein the distributor sheet comprises a main section engaged with the bottom wall of the heat sink depression and a trace extending from the main section for connecting the distributor sheet to ground.

6. An electronic control as set forth in claim 5 wherein the distributor sheet is made of copper and the main section has a shape corresponding to that of the bottom wall of the heat sink depression.

7. An electronic control as set forth in claim 6 further comprising a plurality of heat-generating components, at least a portion of each of the heat-generating electrical component overlying the distributor sheet.

8. An electronic control as set forth in claim 6 wherein the printed circuit board further includes circuitry mounted on the second face thereof within a space defined by the second face of the printed circuit board and the heat sink.

9. An electronic control as set forth in claim 1 further comprising an enclosure member cooperable with the heat sink for enclosing the printed circuit board.

10. An electronic control as set forth in claim 9 in combination with a motor controlled by the central.

11. Electrical apparatus comprising:
- a printed circuit board made of electrically insulating material and having circuitry thereon including at least one electrical component which generates heat in operation that must be dissipated to prevent failure, the heat-generating electrical component being mounted on a first face of the printed circuit board;
- a heat sink for transferring heat from the heat-generating electrical component on the printed circuit board, the heat sink comprising a plate made of thermally conductive material, the plate including a depression having a bottom wall lying generally in a plane, at least portions of the plate adjacent to the depression being disposed out of the plane to one side thereof;
- the heat sink being disposed adjacent to a second face of the printed circuit board, the bottom wall of the depression being in thermal contact with the second face of the printed circuit board generally opposite the heat-generating electrical component on the first face of the printed circuit board, the heat sink and printed circuit board being constructed and arranged for transferring heat through the printed circuit board generally from the first face to the second face and thence to the heat sink, the printed circuit board electrically isolating the heat sink from the circuitry on the printed circuit board.

12. Apparatus as set forth in claim 11 wherein the control is free of electrically insulating material between the bottom wall of the heat sink depression and the second face of the printed circuit board.

13. Apparatus as set forth in claim 12 further comprising a distributor sheet of thermally conductive material mounted on the second face of the printed circuit board opposite the heat-generating electrical component, the distributor sheet distributing the heat transferred from the electrical component through the printed circuit board over the volume of the distributor sheet, the bottom wall of the heat sink engaging the distributor sheet.

14. Apparatus as set forth in claim 13 wherein the bottom wall is in face-to-face engagement with the distributor sheet over substantially the entire surface area of the bottom wall.

15. Apparatus as set forth in claim 14 wherein the distributor sheet is made of copper and has a shape corresponding to that of the bottom wall of the heat sink depression.

16. Apparatus as set forth in claim 15 further comprising a plurality of heat-generating electrical components, at least a portion of each of the heat-generating electrical components overlying the distributor sheet.

17. Apparatus as set forth in claim 15 wherein the printed circuit board further includes circuitry mounted on the second face thereof within a space defined by the second face of the printed circuit board and the heat sink.

* * * * *